US011776927B2

(12) United States Patent
Behrens et al.

(10) Patent No.: US 11,776,927 B2
(45) Date of Patent: Oct. 3, 2023

(54) SEMICONDUCTOR DEVICE INCLUDING A SOLDER COMPOUND CONTAINING A COMPOUND SN/SB

(71) Applicant: Infineon Technologies AG, Neubiberg (DE)

(72) Inventors: Thomas Behrens, Wenzenbach (DE); Alexander Heinrich, Bad Abbach (DE); Evelyn Napetschnig, Diex (AT); Bernhard Weidgans, Bernhardswald (DE); Catharina Wille, Regensburg (DE); Christina Yeong, Johor (MY)

(73) Assignee: Infineon Technologies AG, Neubiberg (DE)

( * ) Notice: Subject to any disclaimer, the term of this patent is extended or adjusted under 35 U.S.C. 154(b) by 253 days.

(21) Appl. No.: 17/376,372

(22) Filed: Jul. 15, 2021

(65) Prior Publication Data
US 2022/0216173 A1    Jul. 7, 2022

Related U.S. Application Data

(62) Division of application No. 16/556,823, filed on Aug. 30, 2019, now Pat. No. 11,069,644.

(30) Foreign Application Priority Data

Sep. 27, 2018    (DE) ..................... 10 2018 123 924.6

(51) Int. Cl.
*H01L 23/00*    (2006.01)
*B23K 35/26*    (2006.01)
*C22C 13/02*    (2006.01)

(52) U.S. Cl.
CPC ............ *H01L 24/29* (2013.01); *B23K 35/262* (2013.01); *C22C 13/02* (2013.01); *H01L 24/83* (2013.01);
(Continued)

(58) Field of Classification Search
CPC .... H01L 24/29; H01L 24/83; H01L 2224/014
See application file for complete search history.

(56) References Cited

U.S. PATENT DOCUMENTS 6,333,563 B1    12/2001   Jackson
2002/0149113 A1  10/2002   Ray
(Continued)

OTHER PUBLICATIONS

"Phase Equlibria Studies of the Sn—Sb—Ni System at 270C", Yue-ting Chen, et al. Department of Chemical Engineering, 2010.
(Continued)

*Primary Examiner* — Dale E Page
*Assistant Examiner* — Wilner Jean Baptiste
(74) *Attorney, Agent, or Firm* — Dicke, Billig & Czaja, PLLC

(57) ABSTRACT

A semiconductor device and method is disclosed. In one embodiment, the semiconductor device comprises a semiconductor die comprising a first surface and a second surface opposite to the first surface, a first metallization layer disposed on the first surface of the semiconductor die, a first solder layer disposed on the first metallization layer, wherein the first solder layer contains the compound Sn/Sb, and a first contact member comprising a Cu-based base body and a Ni-based layer disposed on a main surface of the Cu-based base body, wherein the first contact member is connected with the Ni-based layer to the first solder layer.

20 Claims, 7 Drawing Sheets

(52) U.S. Cl.
CPC ......... *H01L 2224/2922* (2013.01); *H01L 2224/29211* (2013.01); *H01L 2224/29239* (2013.01); *H01L 2224/29244* (2013.01); *H01L 2224/29247* (2013.01); *H01L 2224/29255* (2013.01); *H01L 2224/29264* (2013.01); *H01L 2224/29269* (2013.01); *H01L 2224/83447* (2013.01); *H01L 2224/83455* (2013.01); *H01L 2224/83815* (2013.01); *H01L 2924/014* (2013.01); *H01L 2924/0105* (2013.01); *H01L 2924/01028* (2013.01); *H01L 2924/01029* (2013.01); *H01L 2924/01046* (2013.01); *H01L 2924/01047* (2013.01); *H01L 2924/01051* (2013.01); *H01L 2924/01078* (2013.01); *H01L 2924/01079* (2013.01)

(56) References Cited

U.S. PATENT DOCUMENTS

| | | | |
|---|---|---|---|
| 2004/0174660 A1* | 9/2004 | Arai | H01G 9/042 361/523 |
| 2007/0125449 A1 | 6/2007 | Kajiwara et al. | |
| 2008/0166836 A1* | 7/2008 | Jobetto | H01L 23/5389 438/109 |
| 2011/0089568 A1 | 4/2011 | Nishibori et al. | |
| 2012/0313230 A1 | 12/2012 | Mengel | |
| 2013/0126053 A1 | 5/2013 | Chen et al. | |
| 2016/0279741 A1 | 9/2016 | Ukyo | |
| 2017/0169956 A1 | 6/2017 | Miller | |

OTHER PUBLICATIONS

Restriction Requirement dated Aug. 26, 2020 in U.S. Appl. No. 16/556,823.

Non-Final Office Action dated Dec. 10, 2020 in U.S. Appl. No. 16/556,823.

Notice of Allowance dated Mar. 18, 2021 in U.S. Appl. No. 16/556,823.

* cited by examiner

US 11,776,927 B2

SEMICONDUCTOR DEVICE INCLUDING A SOLDER COMPOUND CONTAINING A COMPOUND SN/SB

CROSS-REFERENCE TO RELATED APPLICATION

The present application is a divisional application of U.S. patent application Ser. No. 16/556,823, filed Aug. 30, 2019, and claims priority to German Patent Application No. 10 2018 123 924.6, filed Sep. 27, 2018, which is incorporated herein by reference.

TECHNICAL FIELD

The present disclosure relates to a semiconductor device, an electronic device and to a method for fabricating a semiconductor device.

BACKGROUND

Decisions have been made by the European Union to ban environmentally hazardous substances in the near future. These decisions have been made with regard to end-of-life vehicles ELV and to electrical and electronic Equipment (RoHS, Restriction of (the use of certain) Hazardous Substances in electrical and electronic equipment) and indicated that hazardous substances such as lead should be banned. In particular for power applications semiconductor dies and clips are nowadays soldered with a high Pb based soft solder paste. Since the EU wants to ban Pb, an alternative die and clip attach system has to be developed to be at least as good as the high Pb based paste system.

SUMMARY

A first aspect of the present disclosure relates to a semiconductor device. The semiconductor device according to the first aspect comprises a semiconductor die comprising a first surface and a second surface opposite to the first surface, a first metallization layer disposed on the first surface of the semiconductor die, a first solder layer disposed on the first metallization layer, the first solder layer containing the compound Sn/Sb, and a first contact member comprising a Cu-based base body and a Ni-based layer disposed on a main surface of the Cu-based base body, wherein the first contact member is connected with the Ni-based layer to the first solder layer.

According to an embodiment of the semiconductor device of the first aspect the solder layer further comprises an Ni/Sb phase. According to a further embodiment thereof, the solder comprises one or more further phases wherein the Ni/Sb phase is the dominant phase. The one or more further phases can be a Ni/Sn phase or two or three Ni/Sn phase of different material composition.

According to an embodiment of the semiconductor device of the first aspect the compound Sn/Sb of the solder layer is Pb free.

According to an embodiment of the semiconductor device of the first aspect the material composition of the compound Sn/Sb is such that the ratio of Sb in the compound is in a range from 17% to 90%. Such a ratio can be provided in order to reach a melting temperature of the solder material greater than 270° C.

According to an embodiment of the semiconductor device of the first aspect besides the ratio of Sb, the material composition is comprised of Sn or Sn with other materials, wherein Sn is predominant. The other materials may comprise one or more Ag, Au, Pt, Cu, Ni, and Pd.

According to an embodiment of the semiconductor device of the first aspect the material composition of the compound Sn/Sb is such that the melting point of the compound Sn/Sb is higher than 270° C. As already mentioned above this can, for example, be achieved by adjusting a ratio of Sb in a range from 17% to 90% in the Sb/Sn solder material which is deposited on the semiconductor die. During second level soldering a minimum melting temperature of 270° C. of the solder material is required.

According to an embodiment of the semiconductor device of the first aspect a thickness of the Ni-based layer is in a range from 100 nm to 7 µm.

According to an embodiment of the semiconductor device of the first aspect the contact member is comprised of a leadframe, a clip, a direct bonded copper, or an active metal brazing.

According to an embodiment of the semiconductor device of the first aspect a thickness of the contact member is in a range from 100 µm to 5 mm.

According to an embodiment of the semiconductor device of the first aspect the first metallization layer comprises a stack of two or more layers. The layers may comprise one or more of a Ti layer, an NiV layer, an NiP layer, an Ag layer, or an Al layer.

According to an embodiment of the semiconductor device of the first aspect the semiconductor die is one or more of a power die, a transistor die, a power transistor die, a vertical transistor die, an IGBT die, a diode die, or any other die which comprises which comprises a vertical structure and comprising contact pads on both opposing main surfaces.

According to an embodiment of the semiconductor device of the first aspect, the semiconductor device further comprises a second metallization layer disposed on the second surface of the semiconductor die, a second solder layer disposed on the second metallization layer, the second solder layer containing a compound Sn/Sb, a second contact member comprising a Cu-based base body and a Ni-based layer disposed on a main surface of the Cu-based base body, wherein the second contact member is connected with the Ni-based layer to the second solder layer. In such an embodiment the semiconductor die can be comprised of one or more of the types of semiconductor dies as were mentioned above.

According to an embodiment of the semiconductor device of the first aspect the second contact member is one or more of a clip, a directed bonded copper, an active metal braze, or a heat spreader.

According to an embodiment of the semiconductor device of the first aspect, wherein the first contact member is a leadframe and the second contact member is a clip.

A second aspect of the present disclosure relates to a semiconductor device. The semiconductor device according to the second aspect comprises a semiconductor chip comprising a first main surface and a second main surface opposite to the first main surface, a first contact member comprising a Cu-based base body and a Ni-based layer disposed on a main surface of the Cu-based base body, and a solder compound containing the compound Sn/Sb and being disposed between the semiconductor chip and the Ni-based layer.

The semiconductor chip of the semiconductor device of the second aspect may be comprised of a semiconductor die comprising a first surface and a second surface opposite to the first surface, and a first metallization layer disposed on the first surface of the semiconductor die in which case the first solder layer is disposed on the first metallization layer.

Further embodiments of the semiconductor device of the second aspect can be formed with embodiments of a semiconductor device of the first aspect or by adding one or more features as described in embodiments of a semiconductor device described further below.

A third aspect of the present disclosure relates to a semiconductor device. The semiconductor device according to the third aspect comprises an electronic component comprising a base body and a metallization layer disposed on a main surface of the base body, a solder layer disposed on the first metallization layer, the solder layer containing an Ni/Sb phase, and contact member comprising a Cu-based base body and a Ni-based layer disposed on a main surface of the Cu-based base body, wherein the contact member is connected with the Ni-based layer to the solder layer.

According to an embodiment of the semiconductor device of the third aspect, the solder layer contains a compound Sn/Sb. According to this embodiment, the solder process is carried out in such a way that an Sn/Sb solder material is not completely transformed into Ni/Sb and other intermetallic phases. According to another embodiment, the solder layer does not contain a compound Sn/Sb in which case the solder process is carried out in such a way that an Sn/Sb solder material is completely transformed into Ni/Sb and other intermetallic phases.

Further embodiments of the semiconductor device of the third aspect can be formed with embodiments of a semiconductor device of one of the first or second aspects or by adding one or more features as described in embodiments of a semiconductor device described further below.

A forth aspect of the present disclosure relates to a method for fabricating a semiconductor device. The method according to the forth aspect comprises providing a contact member comprising a Cu-based base body and a Ni-based layer disposed on a main surface of the Cu-based base body, providing a semiconductor die comprising a first surface and a second surface opposite to the first surface and a metallization layer disposed on the first surface of the semiconductor die, applying a solder material on one or more of the metallization layer of the semiconductor die or the Ni-based layer of the contact member, the solder material being based on a compound Sn/Sb, arranging the semiconductor die onto the contact member so that the soldering material is disposed between them, performing a solder process, in particular a reflow process, and thereby transforming the solder material into a solder layer and connecting the contact member with the semiconductor die.

According to an embodiment of the method according to the forth aspect, performing the reflow process comprises generating an Ni/Sb phase and one or more further phases, if any (see next paragraph). According to an embodiment thereof, the reflow process is carried out in such a way that the resulting solder layer still also contains the compound Sn/Sb. According to another embodiment the reflow process is carried out in such a way that the resulting solder layer does not contain the compound Sn/Sb.

According to an embodiment of the method according to the forth aspect, performing the reflow process comprises generating a Ni/Sb phase and one or more further phases wherein the Ni/Sb phase is the dominant phase. The one or more further phases may comprise an Ni/Sn phase or two more Ni/Sn phases of different material composition.

According to an embodiment of the method according to the forth aspect, the solder material is applied on both the semiconductor die and the contact member wherein equal or different kinds of solder material can be used.

According to an embodiment of the method according to the forth aspect, the solder material is applied in the form of a solder paste. The solder paste can be applied by dispensing or printing onto the semiconductor die or the contact member.

According to an embodiment of the method according to the forth aspect, a semiconductor die is provided having first and second metallization layers on its first and second main surfaces, and after arranging the semiconductor die with its first surface onto a first contact member, solder material is applied onto the second surface of the semiconductor die, a second contact member is arranged above the second surface so that the solder material is disposed in between, followed by a reflow process as already described above. With this embodiment a device as shown in FIG. 2 may be fabricated.

Further embodiments of the method of the forth aspect can be formed with embodiments of a semiconductor device of one of the first to third aspects or by adding one or more features as described in embodiments of a semiconductor device described further below.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

FIG. 4 comprises

DETAILED DESCRIPTION OF THE DRAWINGS

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1:
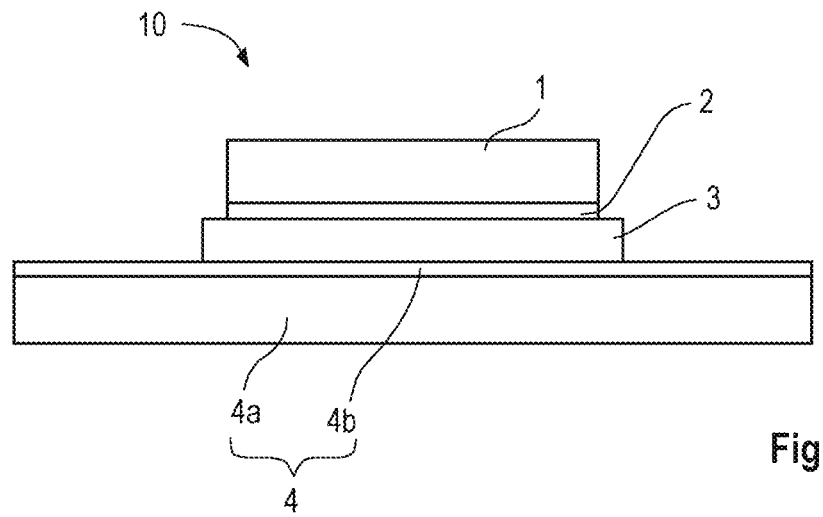
FIG. 1 shows a schematic cross-section of an example of a semiconductor device according to one or more of the first to third aspects, the semiconductor device being connected with one of its main surfaces to a contact element via a solder layer containing the compound Sn/Sb.

FIG. 1 shows an example of a semiconductor device according to one or more of the first to third aspects. The semiconductor device 10 of FIG. 1 comprises a semiconductor die 1 comprising a first lower main surface and a second upper main surface opposite to the first surface. The semiconductor device 10 comprises a metallization layer 2 which is disposed on the first surface of the semiconductor die 1. The metallization layer 2 may be connected with an electronic device or circuitry disposed in the semiconductor die and may comprise one or more metallic layers.

The semiconductor device 10 of FIG. 1 further comprises a solder layer 3 disposed on the metallization layer 2, wherein the solder layer 3 contains the compound Sn/Sb. The solder layer 3 may further contain an Ni/Sb phase and possibly further phases, in particular Ni/Sn phases, wherein the Ni/Sb is dominant.

The semiconductor device 10 of FIG. 1 further comprises a contact member 4 comprising a Cu-based base body 4a and a Ni-based layer 4b disposed on a main surface of the Cu-based base body 4a, wherein the contact member 4 is connected with the Ni-based layer 4b to the solder layer 3.

Figure 2:
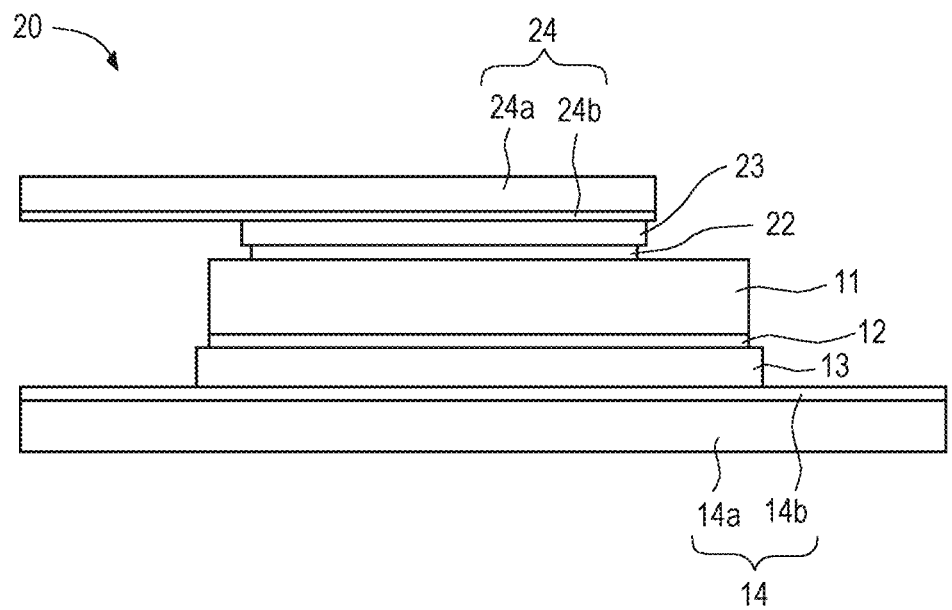
FIG. 2 shows a schematic cross-section of an example of a semiconductor device according to one or more of the first to third aspects, the semiconductor device being connected with a first one of its main surfaces to a leadframe element via a solder layer containing the compound Sn/Sb, and with a second one of its main surfaces to a clip via a solder layer containing the compound Sn/Sb.

FIG. 2 shows an example of a semiconductor device according to one or more of the first to third aspects. The semiconductor device 20 of FIG. 2 comprises a semiconductor die 11 comprising a first surface and a second surface opposite to the first surface and a first metallization layer 12 disposed on the first surface of the semiconductor die 11, and a second metallization layer 22 disposed on the second surface of the semiconductor die 11. The semiconductor device 20 furthermore comprises a first solder layer 13 disposed on the first metallization layer 12, and a second solder layer 23 disposed on the second metallization layer 22, wherein both the first and second solder layer 13 and 23 contain a compound Sn/Sb. The semiconductor device 20 furthermore comprises a first contact member 4 comprising a Cu-based base body 4a and a Ni-based layer 4b disposed on a main surface of the Cu-based base body 4a, wherein the first contact member 4 is connected with the Ni-based layer 4b to the first solder layer 3. The semiconductor device 20 furthermore comprises a second contact member 24 comprising a Cu-based base body 24a and a Ni-based layer 24b disposed on a main surface of the Cu-based base body 24a, wherein the second contact member 24 is connected with the Ni-based layer 24b to the second solder layer 23.

Figure 3:
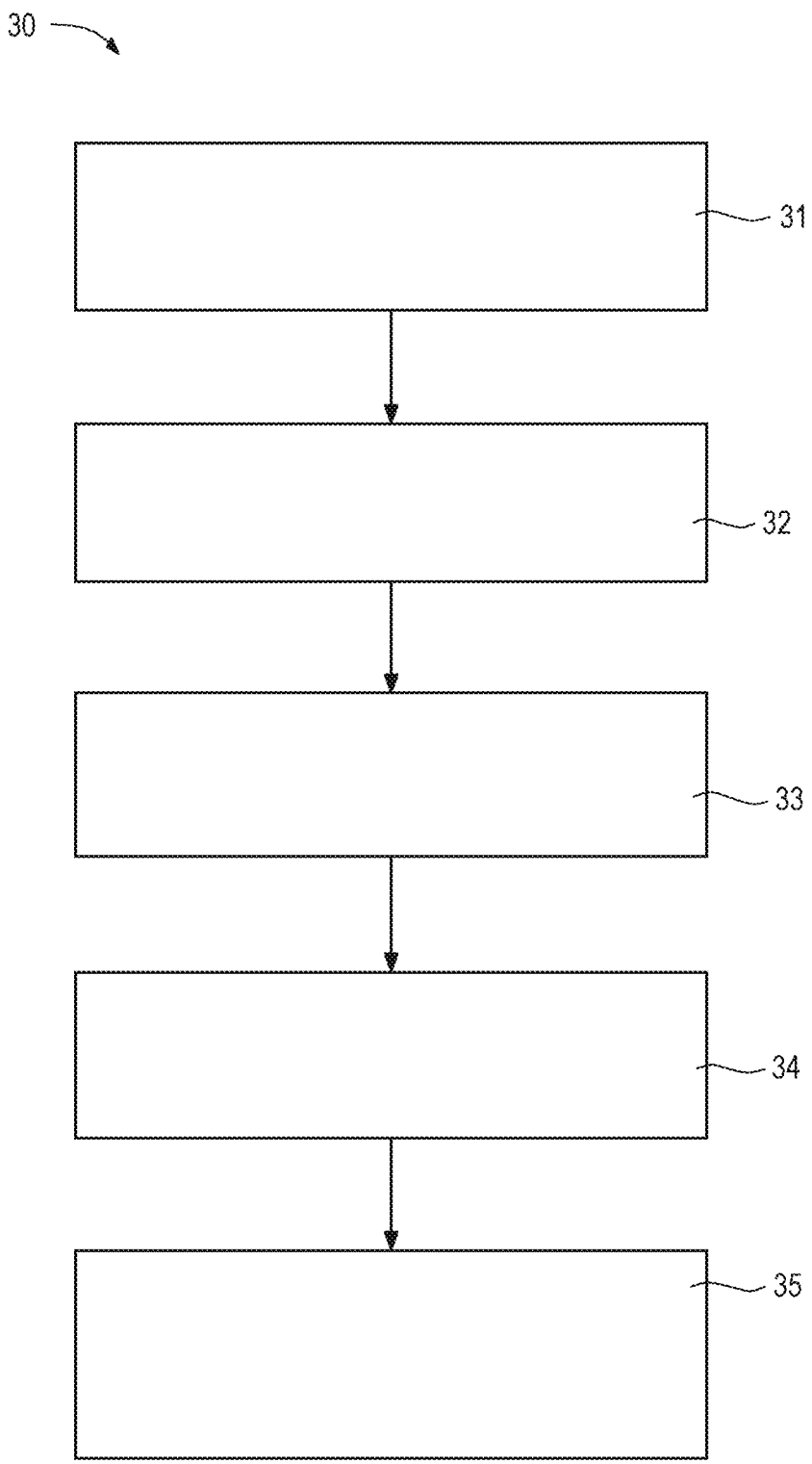
FIG. 3 shows an example of a flow diagram of a method for fabricating a semiconductor device according to the forth aspect, the method comprising in particular the disposing of solder material on a semiconductor die, the solder material being based on the compound Sn/Sb.

FIG. 3 shows a flow diagram for illustrating a method for fabricating a semiconductor device according to the forth aspect of the present disclosure.

As shown in FIG. 3, the method 30 comprises providing a contact member comprising a Cu-based base body and a Ni-based layer disposed on a main surface of the Cu-based base body (31), providing a semiconductor die comprising a first surface and a second surface opposite to the first surface and a metallization layer disposed on the first surface of the semiconductor die (32), applying a solder material on one or more of the metallization layer of the semiconductor die or the Ni-based layer of the contact member, the solder material being based on a compound Sn/Sb (33), arranging the semiconductor die onto the contact member so that the soldering material is disposed between them (34), and performing a solder process, in particular a reflow process, and thereby transforming the solder material into a solder layer and connecting the contact member with the semiconductor die (35).

As indicated above, it is possible to apply the solder material onto one or both of the semiconductor die and the contact member. The solder material can be applied in the form of a solder paste by dispensing or printing.

After placement of the semiconductor die onto the contact member, the reflow process may be performed by heating the stack in a reflow or box oven with a specific temperature profile which fits to the mentioned materials and thicknesses. Afterwards the standard production flow is followed.

FIG. 4 comprises FIG. 4A to 4F and shows cross-sectional representations of intermediate products for illustrating an exemplary method for fabricating a semiconductor according to a forth aspect.

Figure 4A:
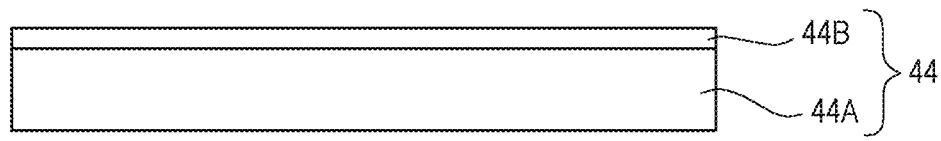
FIG. 4A to 4F show schematic cross-sectional representations of intermediate products and an end product to illustrate an example of a method of fabricating a semiconductor device according to the forth aspect, wherein the method shows the fabrication of a semiconductor device as shown in FIG. 2.

As shown FIG. 4A, a leadframe 44 is provided, the leadframe 44 comprising a Cu-based base body 44A and a Ni-based layer 44B disposed on a main surface of the base body 44A. The Cu-based base body 44A might be comprised of pure Cu, or an alloy of Cu and another metal, and it may also comprise some dopings.

Figure 4B:
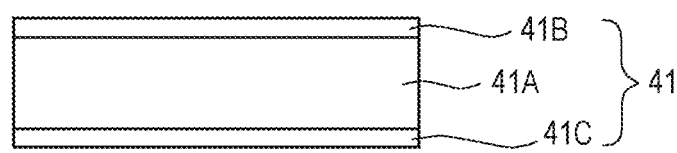

As shown FIG. 4B, a semiconductor chip 41 is provided comprising a semiconductor die 41A, a first metallization layer 41B disposed on a first main surface of the semiconductor die 41A, and a second metallization layer 41C disposed on a second main surface of the semiconductor die 41A. The semiconductor die 41A may comprise one or more of a power die, a transistor die, a power transistor die, a vertical transistor die, an IGBT die, a diode die, or any other die which comprises a vertical structure and comprises contact pads on both opposing main surfaces.

Figure 4C:
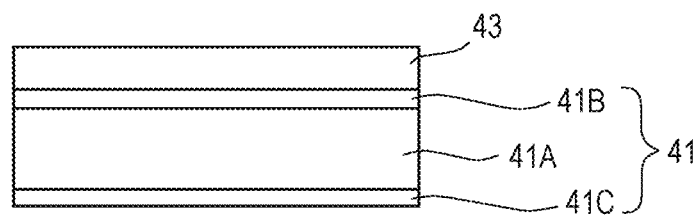

As shown FIG. 4C, a first solder material 43 is applied onto the first metallization layer 41B of the semiconductor die 41A by dispensing or printing.

Figure 4D:
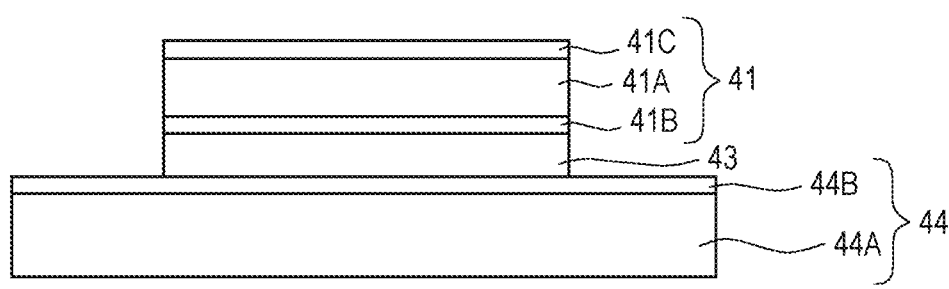

As shown FIG. 4D, the semiconductor chip 41 is placed onto the leadframe 44, i.e. onto the Ni based layer 44B of the leadframe 44 so that the first solder material 43 is disposed between them.

Figure 4E:
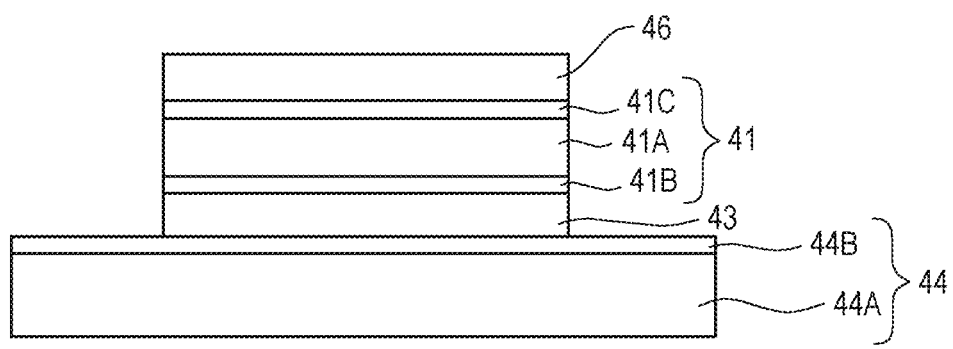

As shown FIG. 4E, a second solder material 46 is applied onto the semiconductor chip 41, i.e. onto the second metallization layer 41C. The second solder material 46 can be dispensed or printed onto the upper surface of the equal or different to the first solder material 43.

Figure 4F:
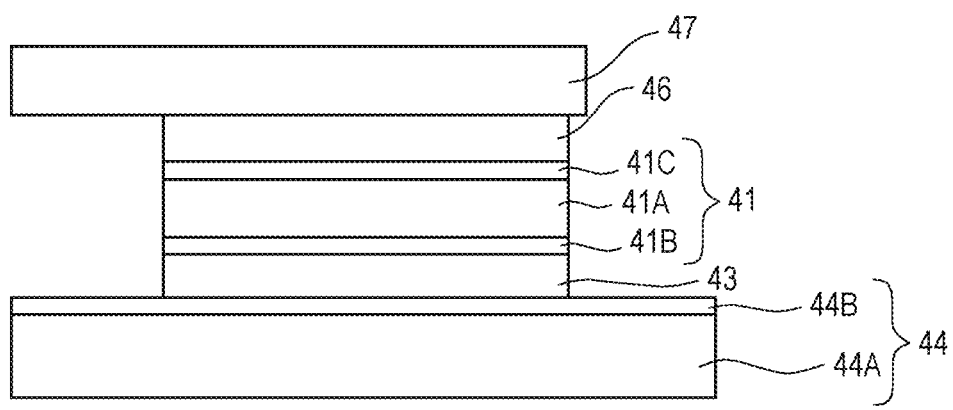

As shown FIG. 4F, a Cu based clip 47 is placed onto the second solder material 46. The clip 47 might be comprised of pure Cu, or an alloy of Cu and another metal, and it may also comprise some dopings.

Thereafter a reflow process is performed by heating the stack in a reflow or box oven with a specific temperature profile fitting to the solder materials and their thicknesses. Thereby the solder materials are transformed into respective solder layers and the semiconductor chip 41 is connected to the leadframe 44 and the clip 47.

Figure 5:
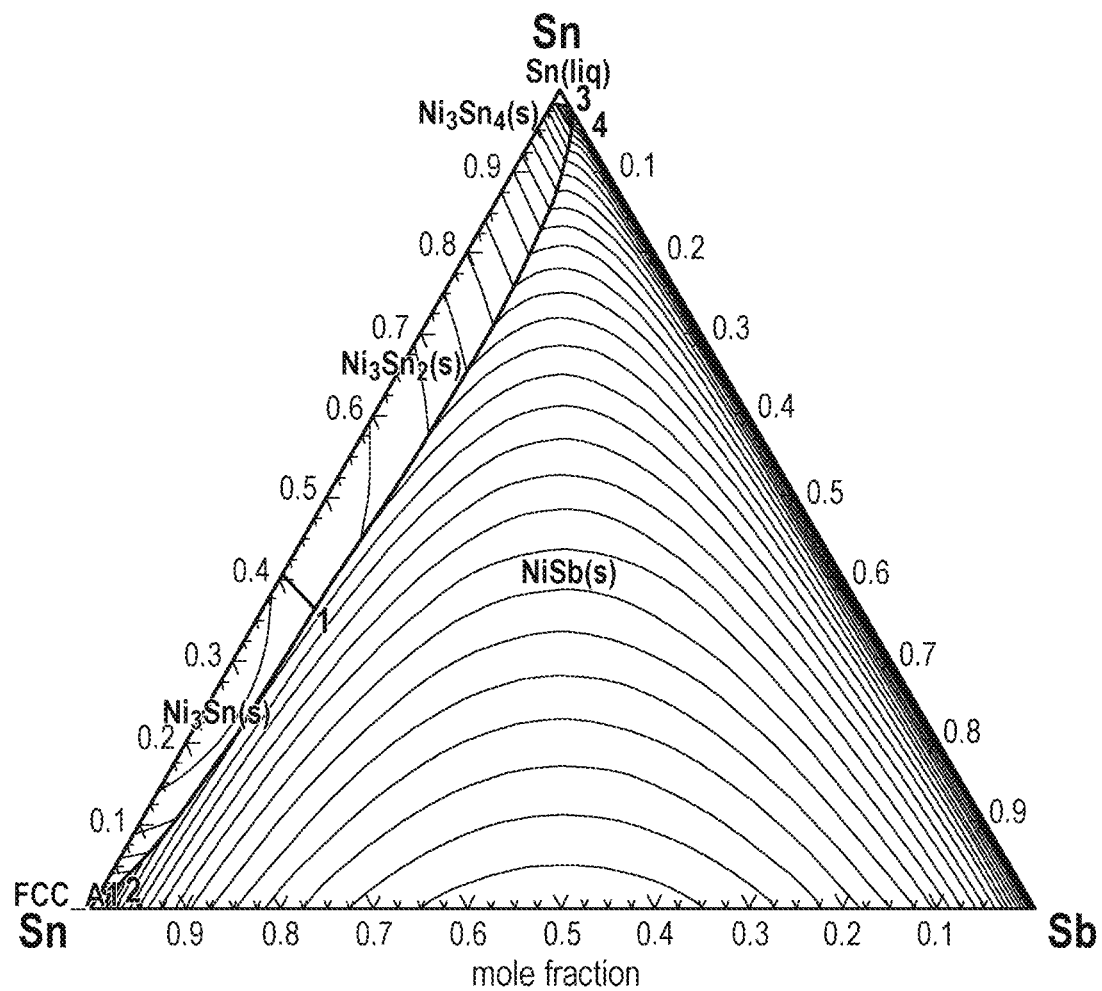
FIG. 5 shows an example of a liquid phase projection of a ternary alloy phase diagram of Sn, Sb, and Ni.

FIG. 5 shows an example of a liquid phase projection diagram of a ternary alloy phase of Sn, Sb, and Ni.

It can be seen in the diagram that without the Sb the Sn would at least partially form a $Ni_3Sn_4$ phase in contact with the Ni, which phase is known to be rather brittle. The Sb content avoids the formation of this brittle phase. As can be derived from the diagram, a minimum amount of Sb is required to force the formation of the hexagonal Ni/Sb-phase instead of the monoclinic $Ni_3Sn_4$ phase. From experimental evidence, it is found that the Sb has to exceed a certain amount, as has already been stated above. The intersection line can also be seen in the ternary alloy phase diagram, but as this was calculated for the equilibrium state and the soldering process is usually in a non-equilibrium state, the required amount of Sb in a solder material is higher than can be derived from thermodynamic calculations.

The details of the diagram of FIG. 5 are as follows.

From a minimum temperature T(min)=673 K to a maximum temperature T(max)=2561.7 K one can recognize the following four-phase intersection points with the liquid:
1: Ni3Sn2_solid(s)/Ni3Sn_solid(s)/NiSb_solid(s)
2: FCC_Al/Ni$_3$Sn_solid(s)/NiSb_solid(s)
3: Ni3Sn2_solid(s)/Ni3Sn4_solid(s)/Snll(liq)
4: Ni3Sn2_solid(s)/Ni3Sn4_solid(s)/NiSb_solid(s)
Wherein
A=Sn, B=Ni, C=Sb
and

|    | X(A)    | X(B)    | X(C)    | K       |
|----|---------|---------|---------|---------|
| 1: | 0.36452 | 0.58003 | 0.05545 | 1933.13 |
| 2: | 0.01766 | 0.97116 | 0.01119 | 1703.77 |
| 3: | 0.98099 | 0.01260 | 0.00642 | 1258.32 |
| 4: | 0.95337 | 0.01172 | 0.03491 | 1245.56 |

Figure 6A:
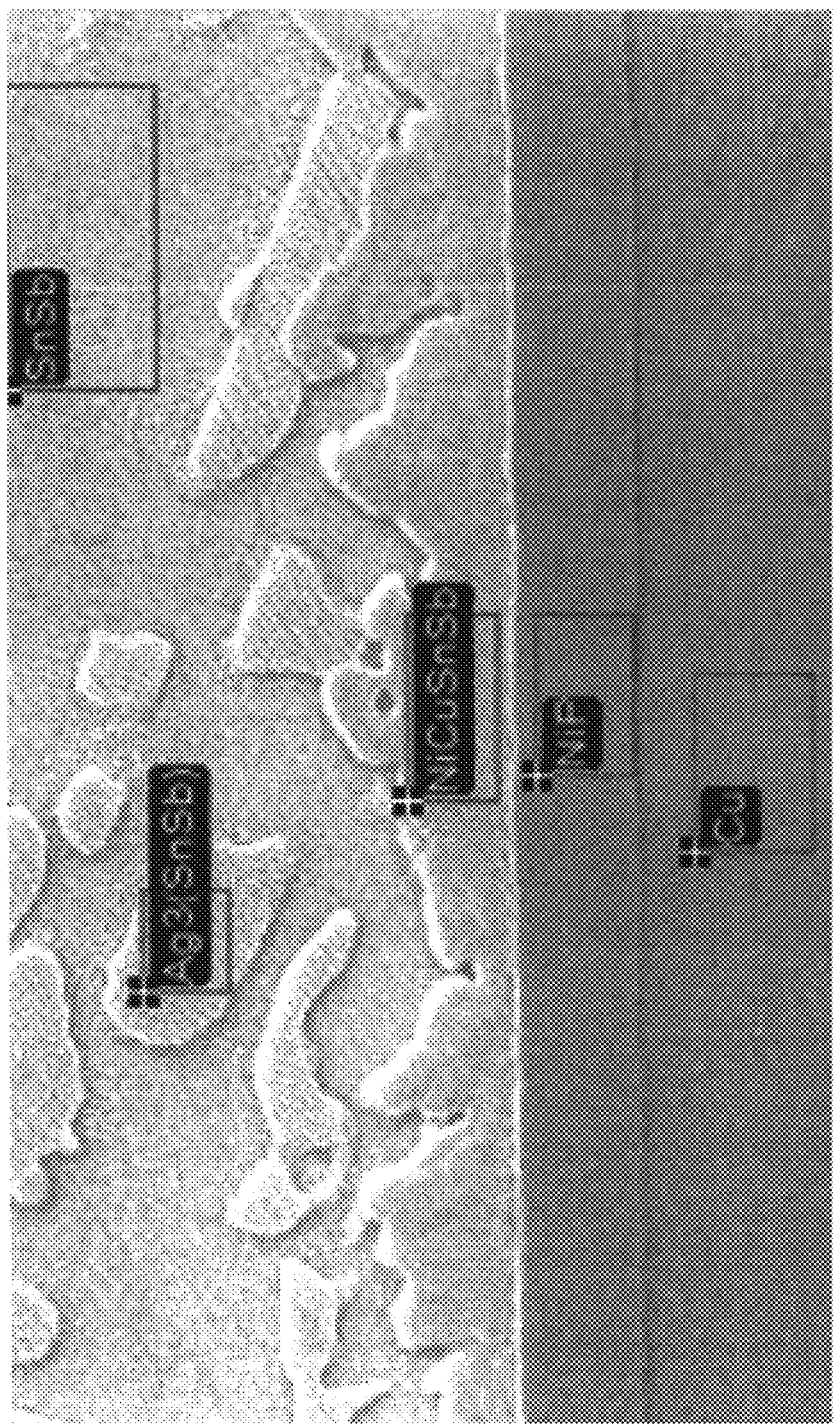
FIG. 6 comprises FIGS. 6A and 6B and shows an SEM-EDX measurement in real (A) and in a schematic representation (B), the measurement illustrating the formation of the intermetallic Ni/Sb phase in the solder layer.
Figure 6B:
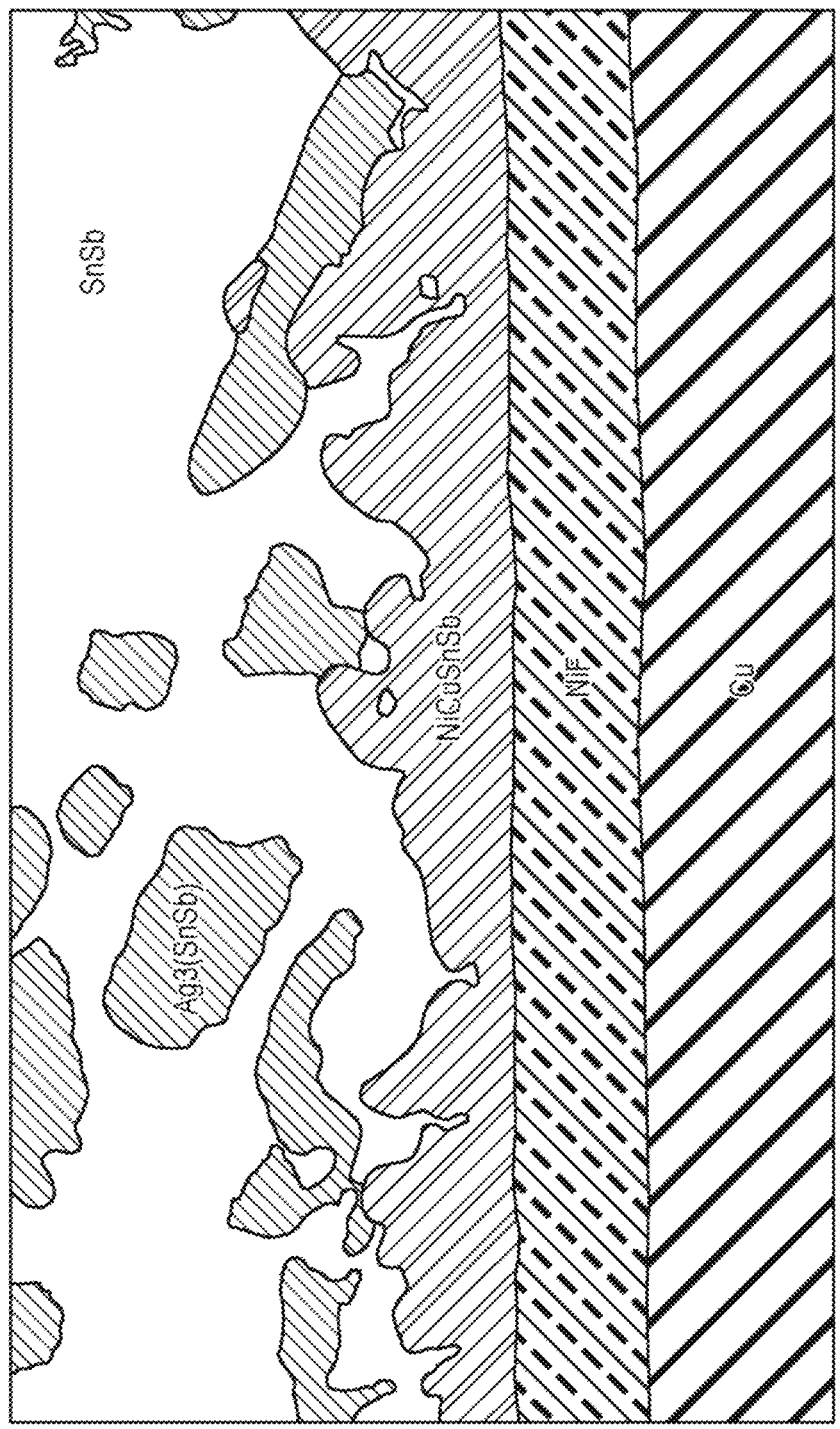

FIG. 6 shows an SEM-EDX measurement which illustrates the formation of the intermetallic Ni/Sb phase in the solder layer.

As can further be seen, none of the brittle $Ni_3Sn_4$ phase is formed even in direct vicinity of the Ni layers in accordance with the alloy phase diagram.

Although the disclosure has been shown and described with respect to one or more implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

The invention claimed is:

1. A method of making a semiconductor device comprising:
   providing a semiconductor die comprising a first surface and a second surface opposite to the first surface;
   arranging a first metallization layer on the first surface of the semiconductor die;
   arranging a first solder layer on the first metallization layer, wherein the first solder layer contains the compound Sn/Sb, wherein the material composition of the compound Sn/Sb is such that the ratio of Sb in the compound is in a range from 17% to 90%; and
   providing a first contact member comprising a Cu-based base body and a Ni-based layer disposed on a main surface of the Cu-based base body, wherein the first contact member is connected with the Ni-based layer to the first solder layer.

2. The method according to claim 1, wherein the compound Sn/Sb of the solder layer is Pb free.

3. The method according to claim 1, wherein besides the ratio of Sb, the material composition is comprised of Sn or Sn with other materials, wherein Sn is predominant.

4. The method according to claim 3, wherein the other materials comprise one or more Ag, Au, Pt, Cu, Ni, and Pd.

5. The method according to claim 1, wherein the material composition of the compound Sn/Sb is such that the melting point of the compound Sn/Sb is higher than 270° C.

6. The method according to claim 1, wherein a thickness of the Ni-based layer is in a range from 100 nm to 7 μm.

7. The method according to claim 1, wherein the contact member is comprised of a leadframe or a clip.

8. The method according to claim 1, wherein a thickness of the contact member is in a range from 100 μm to 5 mm.

9. The method according to claim 1, comprising:
   forming the first metallization layer from a stack of two or more layers.

10. The method according to claim 1, wherein the semiconductor die is one or more of a power die, a transistor die, a power transistor die, a vertical transistor die, an IGBT die, or a diode die.

11. A method of making a semiconductor device, comprising:
   providing a semiconductor die comprising a first surface and a second surface opposite to the first surface;
   arranging a first metallization layer on the first surface of the semiconductor die;
   arranging a first solder layer on the first metallization layer, wherein the first solder layer contains the compound Sn/Sb;
   providing a first contact member comprising a Cu-based base body and a Ni-based layer disposed on a main surface of the Cu-based base body, wherein the first contact member is connected with the Ni-based layer to the first solder layer;
   arranging a second metallization layer on the second surface of the semiconductor die;
   arranging a second solder layer on the second metallization layer, the second solder layer containing a compound Sn/Sb; and
   providing a second contact member comprising a Cu-based base body and a Ni-based layer disposed on a main surface of the Cu-based base body, wherein the second contact member is connected with the Ni-based layer to the second solder layer.

12. The method according to claim 11, wherein the second contact member is one or more of a clip, a direct bonded copper, an active metal braze, or a heat spreader.

13. The method according to claim 11, wherein the first contact member is a leadframe and the second contact member is a clip.

14. A method of making a semiconductor device, comprising:
- providing a semiconductor chip comprising a first main surface and a second main surface opposite to the first main surface;
- arranging a first contact member comprising a Cu-based base body and a Ni-based layer disposed on a main surface of the Cu-based base body; and
- arranging a solder compound containing the compound Sn/Sb between the semiconductor chip and the Ni-based layer, wherein the material composition of the compound Sn/Sb is such that the ratio of Sb in the compound is in a range from 17% to 90%.

15. A method of making a semiconductor device, comprising:
- providing a semiconductor die comprising a first surface and a second surface opposite to the first surface;
- arranging a first metallization layer disposed on the first surface of the semiconductor die;
- arranging a first solder layer disposed on the first metallization layer, wherein the first solder layer contains the compound Sn/Sb; and
- providing a first contact member comprising a Cu-based base body and a Ni-based layer disposed on a main surface of the Cu-based base body;
- wherein the first contact member is connected with the Ni-based layer to the first solder layer, and
- wherein the solder layer further comprises an Ni/Sb phase.

16. The method according to claim 15, comprising:
- arranging a second metallization layer on the second surface of the semiconductor die;
- arranging a second solder layer on the second metallization layer, the second solder layer containing a compound Sn/Sb; and
- providing a second contact member comprising a Cu-based base body and a Ni-based layer disposed on a main surface of the Cu-based base body, wherein the second contact member is connected with the Ni-based layer to the second solder layer.

17. The method according to claim 15, wherein besides the ratio of Sb, the material composition is comprised of Sn or Sn with other materials, wherein Sn is predominant.

18. The method according to claim 15, wherein the other materials comprise one or more Ag, Au, Pt, Cu, Ni, and Pd.

19. The method according to claim 15, wherein the material composition of the compound Sn/Sb is such that the melting point of the compound Sn/Sb is higher than 270° C.

20. The method according to claim 15, wherein a thickness of the Ni-based layer is in a range from 100 nm to 7 μm.

* * * * *